United States Patent
Kramer et al.

(10) Patent No.: US 9,366,742 B2
(45) Date of Patent: Jun. 14, 2016

(54) REDUCING MOTION ARTEFACTS IN MRI

(75) Inventors: Aletta J. W. Kramer, Utrecht (NL);
Frederik Visser, Eindhoven (NL);
Marco H. J. Nijenhuis, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 1012 days.

(21) Appl. No.: 12/742,736

(22) PCT Filed: Dec. 3, 2008

(86) PCT No.: PCT/IB2008/055061
§ 371 (c)(1),
(2), (4) Date: May 13, 2010

(87) PCT Pub. No.: WO2009/074917
PCT Pub. Date: Jun. 18, 2009

(65) Prior Publication Data
US 2011/0116683 A1  May 19, 2011

(30) Foreign Application Priority Data
Dec. 11, 2007 (EP) .................................... 07122804

(51) Int. Cl.
*G06K 9/00* (2006.01)
*G01R 33/567* (2006.01)

(52) U.S. Cl.
CPC .................................. *G01R 33/5676* (2013.01)

(58) Field of Classification Search
None
See application file for complete search history.

(56) References Cited

U.S. PATENT DOCUMENTS

| 5,054,045 | A | * | 10/1991 | Whiting et al. | 378/98.2 |
| 5,931,781 | A | * | 8/1999 | De Boer | 600/415 |
| 5,947,900 | A | * | 9/1999 | Derbyshire et al. | 600/410 |
| 6,006,126 | A | * | 12/1999 | Cosman | 600/426 |
| 6,195,445 | B1 | * | 2/2001 | Dubuisson-Jolly et al. | 382/107 |
| 6,292,683 | B1 | | 9/2001 | Gupta et al. | |
| 6,541,971 | B1 | * | 4/2003 | Dannels | 324/309 |
| 7,561,909 | B1 | * | 7/2009 | Pai et al. | 600/410 |
| 7,818,084 | B2 | * | 10/2010 | Boyden et al. | 700/119 |

(Continued)

FOREIGN PATENT DOCUMENTS

| JP | 03251236 A | 11/1991 |
| WO | 9827437 A1 | 6/1998 |
| WO | 2006086845 A1 | 8/2006 |

OTHER PUBLICATIONS

Derbyshire, J. A., et al.; Dynamic Scan-Plane Tracking Using MR Position Monitoring; 1998; J. Magnetic Resonance Imaging; 8(4)924-932.

Gatehouse, P. D., et al.; Tracking Local Volume 3D-Echo-Planar Coronary Artery Imaging; 2001; MRM; 46:1031-1036.

Korin, H. W., et al.; Spatial-Frequency-Tuned Markers and Adaptive Correction for Rotational Motion; 1995; MRM; 33(5)663-669.

(Continued)

*Primary Examiner* — Feng Niu

(57) ABSTRACT

The invention relates to motion correction in magnetic resonance imaging (MRI), implemented as a MRI apparatus or system, computer programs for such, and a method. A motion pattern of a region of interest (ROI) is estimated by: selecting a fixed point at an anatomical position that is pre-determined to be little or not affected by motion and rotating a point in the ROI that is affected by motion on the basis of motion detected by a navigator or other methods. From the estimated motion pattern of the ROI, the field of view may be adapted by adjusting the gradients and the bandwidth of the RF pulses of the MR system in the acquisition sequence to avoid or reduce motion artefacts. Alternatively motion correction is carried out on the reconstructed images.

9 Claims, 7 Drawing Sheets

(56) References Cited

U.S. PATENT DOCUMENTS

| | | | |
|---|---|---|---|
| 2001/0031920 A1* | 10/2001 | Kaufman et al. | 600/431 |
| 2002/0118373 A1* | 8/2002 | Eviatar et al. | 356/614 |
| 2002/0143246 A1* | 10/2002 | Hardy et al. | 600/410 |
| 2003/0023154 A1* | 1/2003 | Nitz | 600/407 |
| 2003/0088174 A1 | 5/2003 | Sussman et al. | |
| 2004/0155654 A1* | 8/2004 | Brittain | 324/309 |
| 2004/0267111 A1* | 12/2004 | Feinberg | 600/411 |
| 2007/0100225 A1* | 5/2007 | Maschke | 600/407 |
| 2007/0172029 A1* | 7/2007 | Felmlee et al. | 378/95 |
| 2007/0249934 A1* | 10/2007 | Aksit et al. | 600/427 |
| 2008/0027356 A1* | 1/2008 | Chen et al. | 600/587 |
| 2008/0054899 A1* | 3/2008 | Aksoy et al. | 324/307 |

OTHER PUBLICATIONS

Lee, C. C., et al.; A Prospective Approach to Correct for Inter-Image Head Rotation in FMRI; 1998; MRM; 39(2)234-243.

Luk-Pat, G. T., et al.; 3D Coronary-Artery Imaging with Two-Dimensional Images of the Artery as Navigators; 2000; Proc. Intl. Soc. Mag. Reson. Med.; pp. 1627.

Manke, D., et al.; Real-Time Motion Correction of Linear Expansion in MRI by Navigator-based Gradient Scaling; 2000; Proc. Intl. Soc. Mag. Reson. Med.; pp. 400.

Manke, D., et al.; Novel Prospective Respiratory Motion Correction Approach for Free-Breathing Coronary MR Angiography Using a Patient-Adapted Affine Motion Model; 2003; MRM; 50(1)122-131.

* cited by examiner

REDUCING MOTION ARTEFACTS IN MRI

FIELD OF THE INVENTION

The present invention relates to magnetic resonance imaging (MRI), such as a computer based control system for a MRI apparatus and a method for a MRI scanner, in particular correction or compensation of motion occurring in the imaged object during image acquisition.

BACKGROUND OF THE INVENTION

Cardiac and respiratory motion are two of the most common sources causing motion artefacts during a MRI scan. For example, when a subject is breathing, the lungs and kidneys and other organs and tissues move involuntarily and create motion artefacts. These motion artefacts make it difficult to obtain data in the region of interest over time due to the movement of the tissue or organ in the region of interest. Taking the example of breathing, as a cause of breathing a kidney could move left or right in the coronal plane, up or down in the coronal plane or even in and out of the coronal plane. As a consequence, the nearby organs and vessels will be moving as well.

To reduce motion artefacts in MR images, information acquired concurrently in "navigator" signals can be used to correct the plane of acquisition. The navigator signals are produced by pulse sequences which are interleaved with the imaging pulse sequences and which are characterized by the absence of phase encoding. The navigator signal is thus a projection along an axis defined by the readout gradient which is fixed in direction throughout the scan, and therefore relates to one-dimensional motion. If the motion artefact is due to breathing motion, the navigator signal typically determines the respiratory phase by monitoring the movement of the diaphragm.

It is a disadvantage that motion correction is using such navigator signals does not take into account that the entire abdominal or thoracic region does not move similarly to the position of the navigator.

It is a further disadvantage that motion correction using such navigator signals does not take into account the elasticity of most tissue in the abdominal and thoracic region.

OBJECT OF THE INVENTION

Hence, an improved method for correcting for movement during MRI would be advantageous, and in particular a simplified and more reliable method for characterising the movement deviating from the movement of the navigator.

It is a further object of the present invention to provide an alternative to the prior art. In particular, it may be seen as an object of the present invention to provide a MRI system that solves the above mentioned problems of the prior art with correcting motion.

SUMMARY OF THE INVENTION

The inventors have envisaged that for larger anatomical features such as vessels or organs, one end may lie in a first region of the subject that moves whereas another region lies in a second region that hardly moves, or doesn't move at all. When trying to adjust the field-of-view of the MRI apparatus to this scenario, the approach of the present invention is to use at least two points, one in each of the first and second region, assigning one of them as fixed and obtaining the movement of the other from a MRI signal, and then determine the motion pattern of the ROI by selecting a FOV where the used point doesn't move or moves only very little.

Thus, the above described object and several other objects are intended to be obtained in a first aspect of the invention by providing a method for tracking motion of and/or in a subject in magnetic resonance imaging (MRI), the method comprising:
  identifying movement of a moving point within a desired region-of-interest (ROI);
  identifying a fixed point in the subject; and
  rotating the moving point relative to the fixed point in accordance with the movement of the moving point to determine a motion pattern for the ROI.

In the following, a number of preferred and/or optional embodiments, features and elements will be described in relation to the first aspect of the invention. These embodiments, features or elements may be combined with or applied to the second, third, and fourth aspects presented later where applicable.

The fixed point need not be fixed in relation to a stationary part in the MRI apparatus or in the subject. The term "fixed" as used in relation to this point merely indicates that it is assumed to be the least moving point of the two. Thus, the fixed point is preferably selected so that it designates the part of the ROI that moves the least.

The movement of the moving point is preferably identified on the basis of a MRI navigator signal, but other techniques may be applied as well, as will be described later. The identified movement of the moving point need not be along a straight line (one-dimensional). Using a navigator signal containing signals recorded along different gradients (e.g. two-dimensional), a more complex motion of the moving point may be determined. Also, the movement of the moving point need not be in a direction normal to the direction to the fixed point, as various projections may be used when using the movement of the moving point to rotate the moving point in relation to the fixed point. The term "movement of the moving point" designates the movement determined from the navigator signal. It is a nominal movement used for the calculation of a moving pattern for the ROI, i.e. it does not necessarily describe the actual motion of the moving point. The rotation of the moving point in accordance with the movement of the moving point thereby means that the moving point is moved under the constraint of a given distance to the fixed point.

The determination of the motion pattern for the ROI may preferably be carried out by determining a moving frame or line in/on which both the fixed point and the moving point are at rest, or moves as little as possible. Alternatively, it may be carried out applying the constraints that one part of a frame or a line is constrained at the fixed point and then determine the movement of another part when this part is constrained to the moving point.

In the present context, to compensate for motion means to adjust proactively for or to make up for motion artefacts. Proactive adjustments for motion artefacts may be implemented by adjusting the FOV in the acquisition protocol or during acquisition so that motion artefacts in the recorded MRI signals are reduced. Thus, in one embodiment the determined motion pattern for the ROI is used to adjust the FOV in a MR image acquisition to reduce motion artefacts.

Making up for the motion artefacts may be implemented by correcting the recorded MRI signals or the reconstructed images to reduce the motion artefacts. Thus, in alternative embodiments, the determined motion pattern of the ROI is used to correct MRI signals to reduce motion artefacts in these, or to correct reconstructed MR images to reduce motion artefacts in these.

The fixed point may preferably be selected or designated in a reconstructed image from a MRI scout scan of the subject. Similarly, the moving point may be selected or designated in a reconstructed image from a MRI scout scan of the subject, which image preferably comprises motion artefacts.

A scout scan or image, also sometimes referred to as a survey scan or image, is used for the graphical representation of the images to be produced by the upcoming scan. The scout itself is a fast scan with low resolution and large FOV that gives an overview of the anatomy. Typically, a separate screen is generated whereby scouting parameters are determined interactively via a graphical interface. The chosen scout image is displayed while the operator selects the various scouting parameters, this is called planning. Specifically, the operator may indicate the fixed point and the moving point via mouse movement or keyboard input.

Due to the elasticity of the tissue, especially in the abdominal or thoracic region, different points do not move with the same amplitude, e.g. during breathing. But since the navigator signal most often destroy the image at the position of the navigator, the navigator has to be positioned outside the ROI and therefore well away from the moving point. For this reason, it may be preferred to scale the movement from the navigator signal to determine the movement of the moving point.

The invention is especially adapted to correct for motion artefacts in elastic tissue, such as in the abdominal or thoracic region of a subject. Thus in a preferred embodiment, the method according to the first aspect is applied to scanning of vessels in the abdominal or thoracic region of the subject to reduce motion artefacts, such as abdominal and thoracic angiography. The method may also be used to describe motion of the limbs with respect to a fixed point in a joint, such as movement of the arm, rotating about the fixed point in the shoulder.

In a second aspect, the invention provides a magnetic resonance imaging (MRI) system configured to compensate for motion of and/or in a subject, the system comprising:
  user interface configured to receive operator input selecting a moving point in a region-of-interest (ROI) and a fixed point in the subject;
  a software application for compensating for motion of and/or in the subject during MRI, the software application comprising:
    means for determining a movement of the moving point from a MRI signal;
    means for determining a motion pattern for the ROI by rotating the selected moving point in relation to the selected fixed point in accordance with the movement of the moving point; and
    means for compensating for the motion of and/or in the subject using the determined motion pattern.

The system preferably further comprises a unit for generating a MRI navigator signal so that the means for determining movement of the moving point may do son from a MRI navigator signal.

In a third aspect, the invention relates to a computer program product being adapted to enable a computer system comprising at least one computer having data storage means in connection therewith, to control a MRI system to carry out the method according to the first aspect of the invention, preferably by adjusting an acquisition protocol for MRI of a ROI. Hence, in the third aspect, the invention provides a computer program product for compensating for motion of and/or in a subject during magnetic resonance imaging (MRI), the product comprising software applications which provides the following when executed by a processor:
  determining a movement of a moving point from a provided MRI signal;
  determining a motion pattern for a region-of-interest (ROI) by rotating the moving point in relation to a selected fixed point in accordance with the movement of the moving point; and
  compensating for the motion of and/or in the subject using the determined motion pattern.

The third aspect of the invention relates to a computer program product. Such computer program product is adapted to enable a computer system comprising at least one computer having data storage means associated therewith to control a MRI apparatus or a unit of such to carry out the invention. These aspects of the invention are particularly, but not exclusively, advantageous in that the present invention may be implemented by a computer program product enabling a computer system to perform the operations of the first aspect of the invention. Thus, it is contemplated that some known MRI apparatus, or a unit of such, may be changed to operate according to the present invention by installing a computer program product on a computer system controlling the MRI apparatus. Such a computer program product may be provided on any kind of computer readable medium, e.g. magnetically or optically based medium, or through a computer based network, e.g. the Internet.

In a fourth aspect, the invention provides a computer program product for updating a MRI apparatus to apply the method according to the first aspect of the invention, the product comprising means for installing software applications which provides the following when executed by a processor. Hence, in the fourth aspect, the invention provides a computer program product for updating a magnetic resonance imaging (MRI) apparatus to compensate for motion of and/or in a subject during MRI, the product comprising means for installing software applications which provides the following when executed by a processor:
  determining a movement of a moving point from a provided MRI signal;
  determining a motion pattern for a region-of-interest (ROI) by rotating the moving point in relation to a selected fixed point in accordance with the movement of the moving point; and
  compensating for the motion of and/or in the subject using the determined motion pattern.

Again, in the third and fourth aspects, the movement of the moving point is preferably determined from a MRI navigator signal, although other methods for identifying such movement may be applied.

This fourth aspect of the invention is particularly, but not exclusively, advantageous in that the present invention may be accomplished by a computer program product enabling a computer system to carry out the operations of the system of the second aspect of the invention when down- or uploaded into the computer system. Such a computer program product may be provided on any kind of computer readable medium, or through a network.

The gist of the invention may be described as a way of determining a more realistic moving pattern of a ROI by selecting two points in different regions and assigning one of them as fixed. A movement of the other point is determined from a navigator, and this movement is used to determine a rotation movement in relation to the fixed point. This rotation movement is then used as the motion pattern of the ROI to which the FOV may be adjusted to avoid, reduce or correct motion artefacts. In an alternative formulation a fixed point is designated at an anatomical position that is pre-determined to be little or not affected by motion. On the basis of the fixed point and the motion detected by a navigator, a motion pattern for the ROI is estimated from which the field of view may be adapted (or motion correction is carried out on the reconstructed images).

It is stressed that the result of the method according to the first aspect of the invention does not directly allow the attribution to a clinical picture, it relates solely to the improvement of image quality. Also, none of the method steps require interaction with the body.

The individual aspects of the present invention may each be combined with any of the other aspects. These and other aspects of the invention will be apparent from the following description with reference to the described embodiments.

BRIEF DESCRIPTION OF THE FIGURES

The method, system and computer products according to the invention will now be described in more detail with regard to the accompanying figures. The figures show examples of implementing the present invention and are not to be construed as being limiting to other possible embodiments falling within the scope of the attached claim set.

DETAILED DESCRIPTION OF AN EMBODIMENT

In the following, the method for tracking motion of and/or in a subject in MRI according to an embodiment of the invention is described in relation to an exemplary application on the renal artery, such as in abdominal angiography. The embodiments may be applied in imaging of many other anatomical features and this exemplary application shall not restrict the scope of the claims.

Figure 1A:
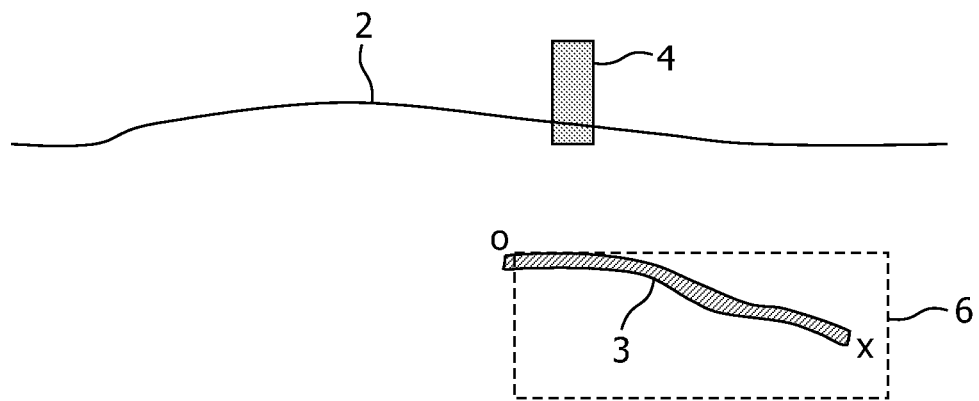
FIGS. 1A and B illustrate determination of moving pattern of a ROI by the application of a method according to the present invention.

FIGS. 1A and B illustrate determination of moving pattern of a ROI by the application of a method according to the present invention. Here, a subject 2 breathes during a MRI scanning, and a navigator 4 is positioned at the dome of the diaphragm to determine the phase and amplitude of the breathing motion. The navigator is generated by RF excitation of a narrow (pencil beam shaped) volume 4, and a non-phase encoded MR signal is received. Presently, such navigator signal is the most common method for determining subject movement during MRI acquisition.

However, other ways to obtain motion information during MRI acquisition exist in MR imaging, such as:

By redundantly scanning the centre region of k-space (i.e. repeatedly in time acquiring data of coarse details of the object) motion information is obtained. This is preferably achieved by way of a so-called 'PROPELLER' sequence.

Special fiducials may be employed at pre-determined portions in or on the object; the MR signals from these fiducials. In a special embodiment the fiducials contain a 19F (Fluorine) compound (e.g. PFOB) that can be imaged at the 19F Larmor frequency.

In the present example, the ROI is a part 2 of a renal artery with point x designating the origin, typically residing in a region only little affected by breathing motion. Point o designates a point on the renal artery residing in a region heavily affected by breathing motion.

Figure 1B:
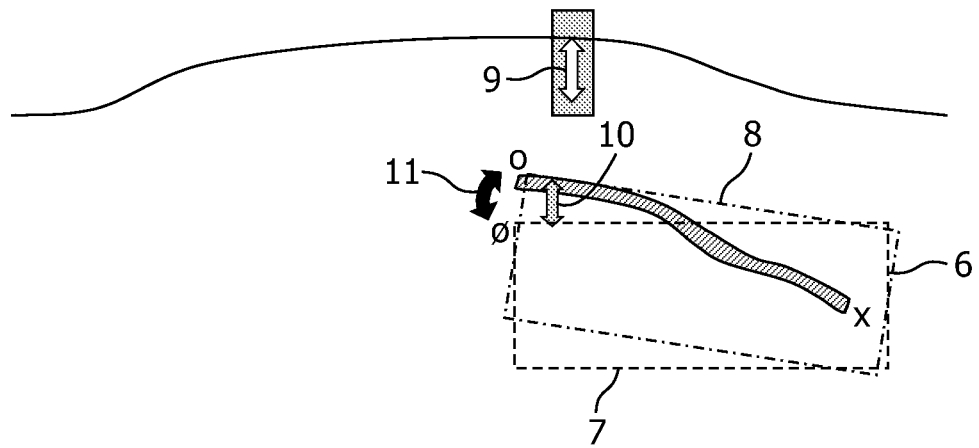

In FIG. 1A, the subject has exhaled, and in FIG. 1B the subject has inhaled. This has resulted in the navigator 4 recording a navigator signal from which the subject movement according to arrow 9 can be determined. As can be seen, point o of the renal artery has moved according to arrow 10 from its old location o and upwards in accordance with the breathing motion of the subject. If no correction is carried out, such movement during MRI acquisition will result in motion artefacts. The movement 10 of point o is related to the movement 9 from the navigator signal and can be determined from this as will be described in detail later in relation to FIG. 3.

It can also be seen that the position of point x has not been affected by the inhalation of the subject, and as such the part 3 of the renal artery in the ROI has slightly rotated according to arrow 11. According to the method of the first aspect of the invention, this motion pattern of the ROI can be determined as follows. Point x is selected as being a fixed point in the subject (although it may move, it is assumed fixed in the following derivation), and point o is selected as a moving point. By determining the movement 10 of the moving point o using the movement 9 from the navigator 4, a frame 6 can be moved according to arrow 11 between positions 7 and 8. The movement 11 of the frame 6 occurs under the assumption that fixed point x does not move, and therefore rotates around fixed point x. Hence by the constraint that positions of fixed point x and moving point o are fixated in the frame 6, the motion pattern of frame 6 will correspond to that of the ROI.

Displacing the FOV according to the motion pattern of the ROI, or equivalently frame 6, during MRI acquisition, will reduce motion artefact in the acquired image.

Figure 2A:
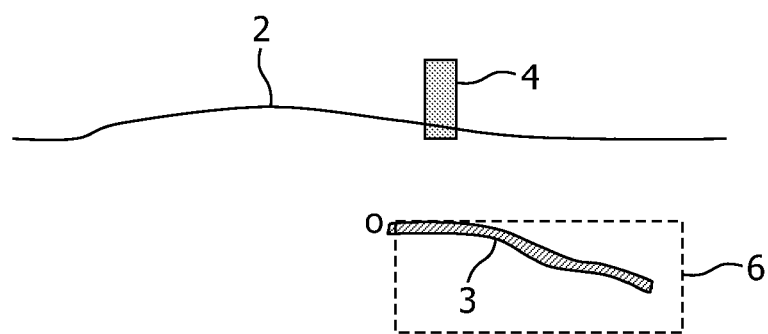
FIGS. 2A and B illustrate a scenario which does not use a fixed point in accordance with the invention.
Figure 2B:
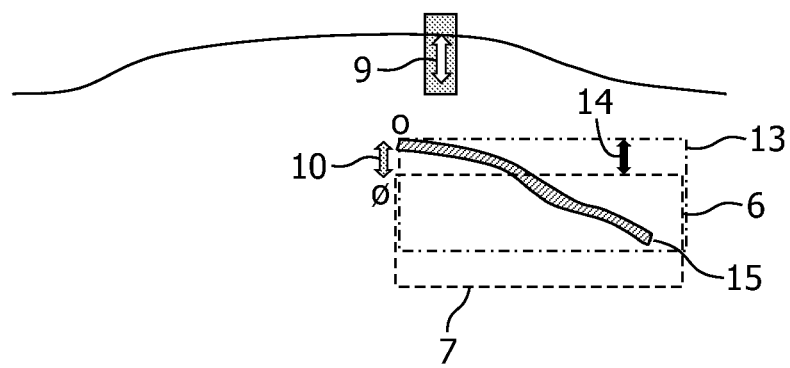

FIGS. 2A and B illustrates a similar scenario as that of FIGS. 1A and B, but without fixed point x. If again a frame 6 is moved according to the movement 10 of the moving point o, the movement 14 of the frame 6 between positions 7 and 13 now equals the movement 10 of moving point o. However, it can be seen that the origin 15 of the renal artery in the opposite end from point o shifts its position in frame 6 between positions 7 and 13. Displacing the field of view according to the motion pattern of frame 6 during MRI acquisition will therefore result in motion artefacts, but this time due to apparent movement of the origin 15.

Figure 3:
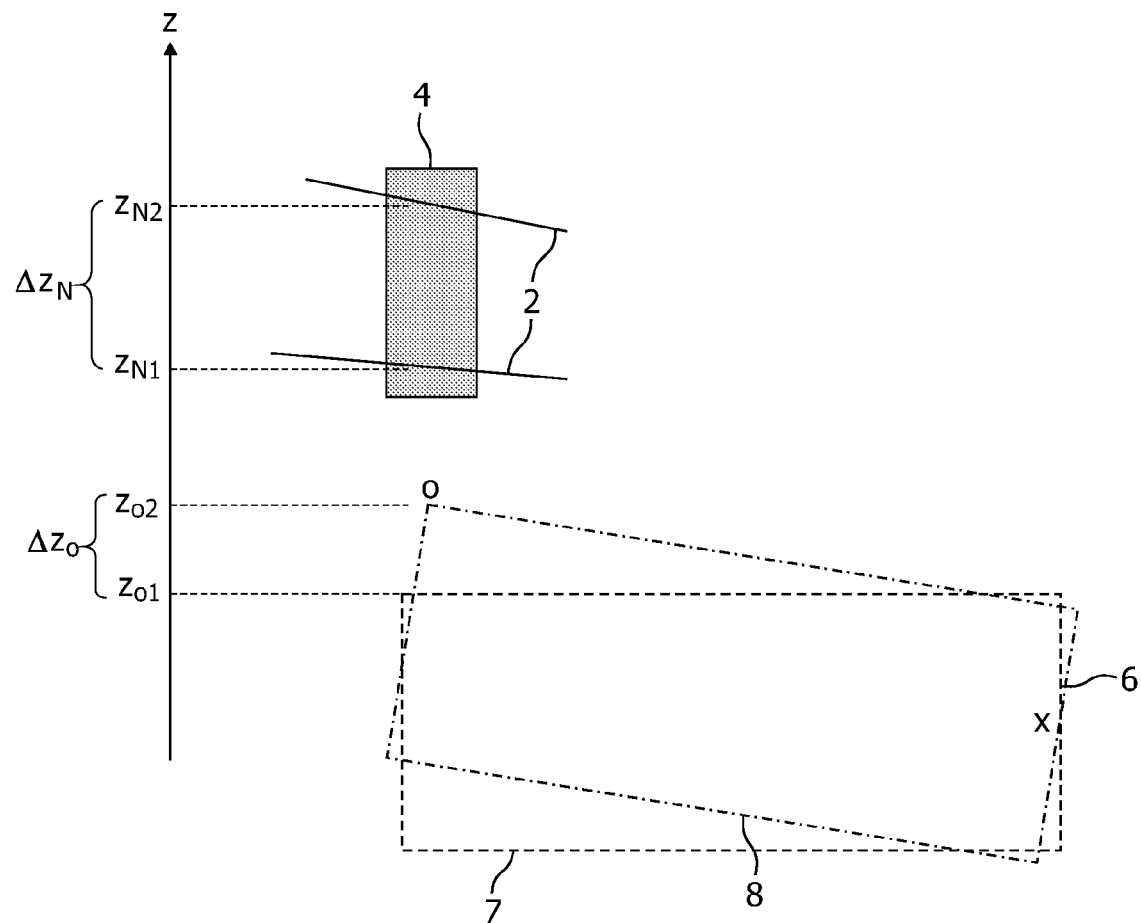
FIGS. 3 and 4 illustrate calculations according to embodiments of the invention.

In the following, the determination of the movement 10 of moving point o is described in relation to FIG. 3. Prior to the acquisition, images (typically at least two) are recorded as a scout scan. These images will show movement of the diaphragm and the ROI during breathing. This can also be done with breath holds (one in inhalation, one in exhalation). From these images, two positions, $z_{o1}$ and $z_{o2}$, of point o can be determined—point o may be the point where the renal artery enters the kidney which can easily be identified by inspection. At the same time, two positions of the anatomical feature to which the navigator will later be locked can be determined, $z_{N1}$ and $z_{N2}$.

Now, the displacements of the navigator and point o are typically not the same, and a scaling factor $\Delta z_o / \Delta z_N$ can be calculated from the positions determined from the breath hold images. This scaling is a result of the tissue elasticity in the region as well as possible transverse displacement, and hence the scaling can also vary from subject to subject. At any time, A, during the later MRI acquisition, the position of point o can be determined from the navigator signal by:

$$z_{oA} = z_{NA} \Delta z_o / \Delta z_N, \quad (1)$$

Figure 4:
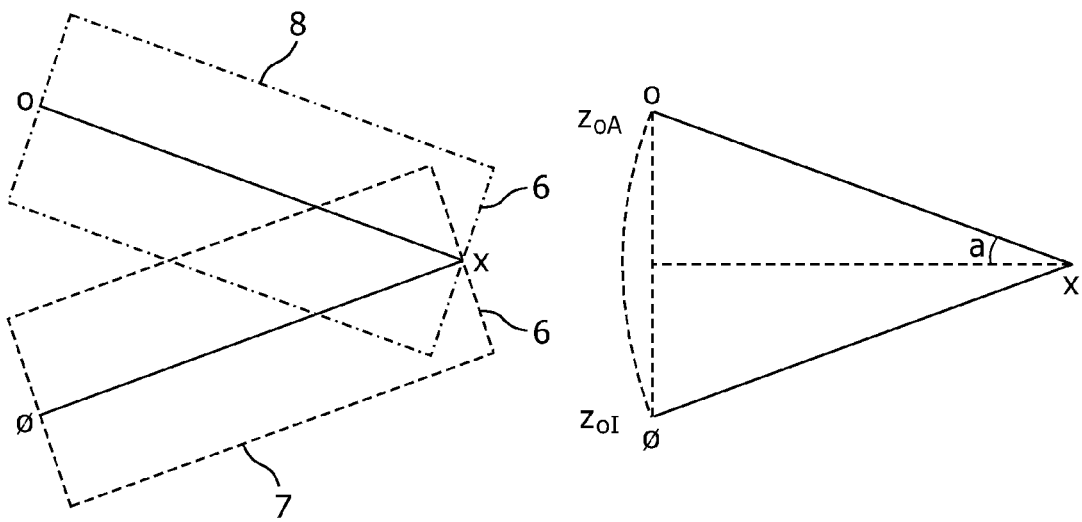

To perform the displacement of the FOV according to the motion pattern of the ROI, or equivalently frame 6, during MRI acquisition, a rotation angle of the frame around the fixed point x can be determined. In the illustration in FIG. 4, the fixed point is located at the border of frame 6. When the moving point o moves from initial position $z_{oI}$ and to position $z_{oA}$ at time A (both determined from scaling the navigator positions), the ROI has rotated angle 2a, where a can be determined trigonometrically:

$$\sin a = \tfrac{1}{2}(z_{oA} - z_{oI}) / |x\, o|, \quad (2)$$

where |x o| is the distance between points o and x as can be determined e.g. from the scout scan or the breath hold images. The moving pattern, or here simply rotation, of frame 6 can be used to perform a similar rotation of the image stack or FOV during image acquisition by adjusting the gradients and the bandwidth of the RF pulses of the MR system. In such case, |x o| can in an example be the length of the stack in oblique-left-right or part of this length.

It is noted that the above determination of ROI rotation angle is one very simple approach for determining ROI motion pattern. Numerous ways of determining such rotation, and optionally also simultaneous displacement, all within the scope of the present invention, can be made depending on the required precision and the specific application.

Figure 5:
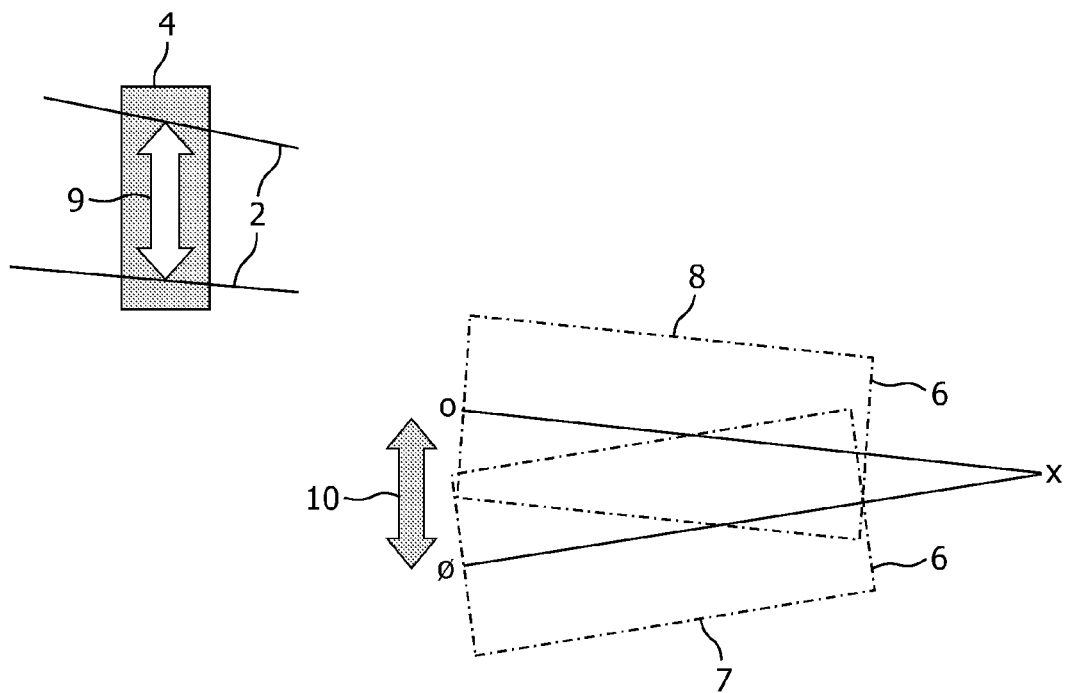
FIGS. 5, 6A and 6B illustrate different scenarios for applying embodiments of the invention.

FIG. 5 illustrates another application example, where the fixed point x is located outside the ROI or the frame 6, so that the pivoting point falls outside the regions that is affected by the movement. This implies that the point of rotation is outside the frame 6 and the entire ROI shifts position. Equation 2 may still be applied, but this time |x o| is longer that the ROI or frame 6. The fixed point x should be in at least the FOV of the scout scan to determine its position and |x o|.

Figure 6A:
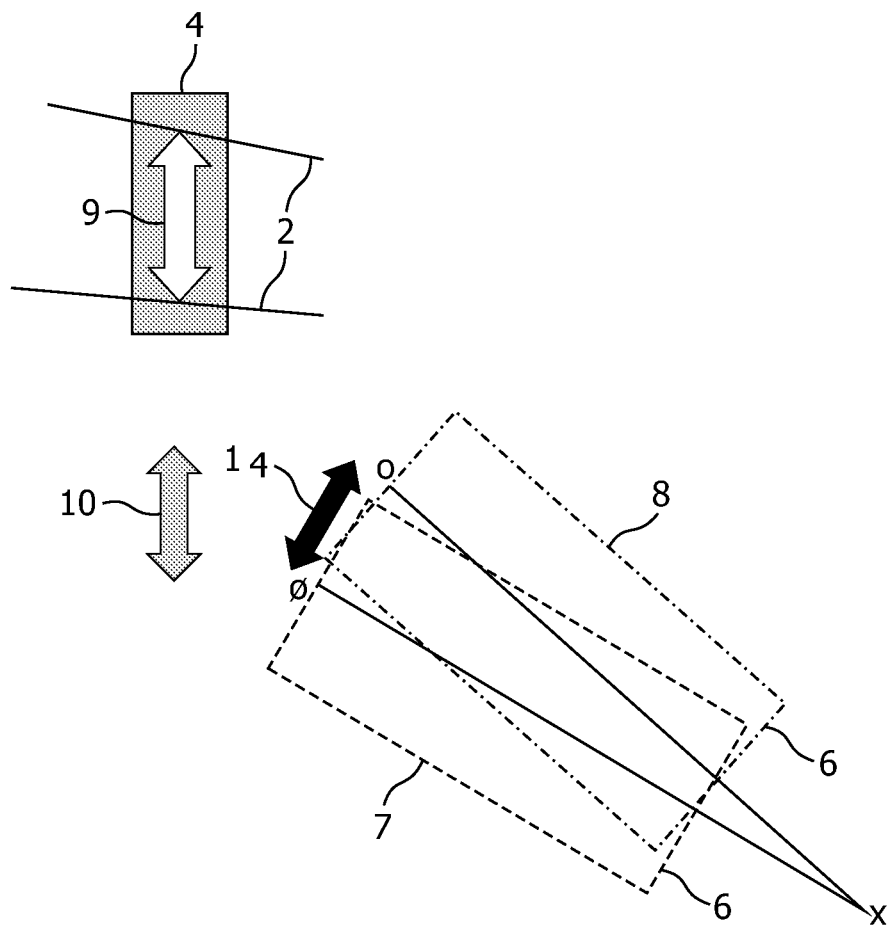
Figure 6B:
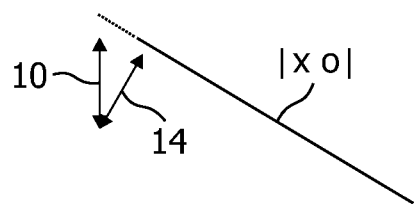

In the previous examples, the movement 9 of the navigator and the movement 10 of the moving point o has been approximately normal to the direction of line |x o| between the moving point o and the fixed point x. This lead to the movement 14 of the ROI or frame 6 to be largely along the same direction as movement 10 (albeit movement 14 describes a rotation, the angle a is typically small and movement 14 will not divert much from a straight line). In another example illustrated in FIG. 6A, the expected movement 10 of the moving point (as deduced from the navigator) forms an angle of approximately 45 degrees with line |x o|. In this case, the movement 10 can be projected to a direction normally to the line between moving point o and fixed point x, as shown in FIG. 6B. Thereby, the movement 14 of the ROI or frame 6 (an i.e. also an alleged movement of moving point o) will form an angle to the movement 10. In this example, the effects of the constrains of a fixed point x are demonstrated.

In other embodiments, the rotation according to the embodiments showed in the above may be combined with translational movement.

In another embodiment, multiple navigators can be used, e.g. one on the diaphragm and one of the abdomen detecting movement in anterior-posterior direction, perpendicular to that on the diaphragm. In such case, more detailed information of the movement of the ROI may be obtained and incorporated in the calculations.

Figure 7:
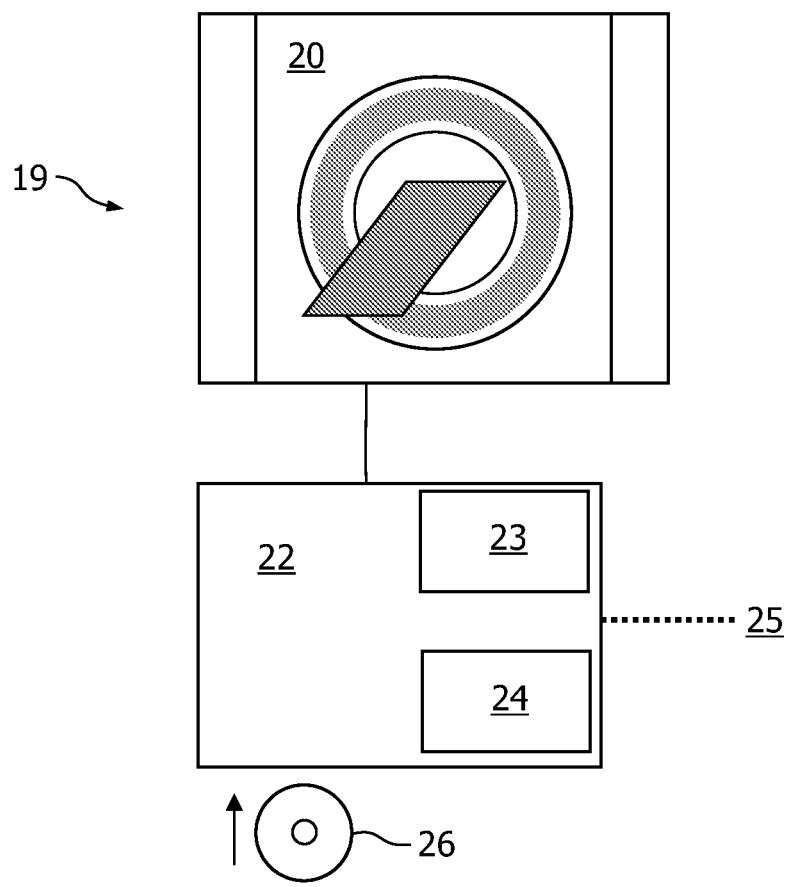
FIG. 7 is a schematic illustration of a MRI system according to an embodiment of the invention.

FIG. 7 is a schematic illustration of a MRI system 19 according to an embodiment of the invention. Here, the MRI scanner 20 is connected to a control unit 22 comprising e.g. user interface (not shown) configured to receive operator input, as well as at least one processor 23 and one memory 24 for holding computer programs to be executed by the processor. The system also comprises a unit for generating a MRI navigator signal, which is typically implemented as a software application comprising:

user interface configured to receive operator input positioning the navigator on an anatomical feature in the subject;

means for interleaving navigator pulses in an image acquisition sequence and recording a navigator signal;

means for determining movement of the navigator from the navigator signal.

The memory 24 holds a software application to be executed by processor 23 for compensating for motion of and/or in the subject during MRI in accordance with an embodiment of the invention. A computer program product for compensating for motion in accordance with an embodiment of the invention may be held on the memory 24 or on CD ROM 26, or may be stored on a remote server accessible through network connection 25.

Also, network connection 25 may be used to download a computer program product for updating the MRI apparatus according to an embodiment of the invention. Such program may also be provided on CD ROM 26.

Figure 8:
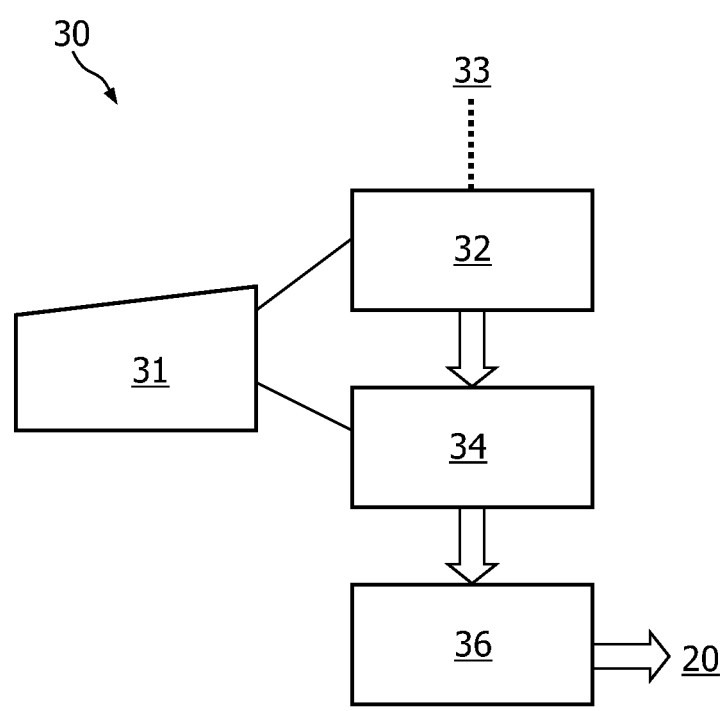
FIG. 8 is a schematic system-chart representing an out-line of the operations of embodiments of the computer program products according to the invention.

FIG. 8 is a schematic system-chart representing an out-line 30 of the operations of embodiments of the computer program products according to the invention as described in the following.

In Box 31, the operator selects the moving point o and the fixed point x in images from scout scans with and without motion artefacts, respectively.

Box 32 provides the means for determining a movement of the moving point from the MRI navigator signal. A navigator signal 33 is provided from the navigator unit, from where navigator position as a function of time can be derived. Using the navigator positions, the movement of the moving point o between consecutive acquisition sequences is determine from Equation (1) in Box 34, Box 34 provides the means for determining a motion pattern for a ROI.

ROI rotation angles between consecutive acquisition sequences can be calculated from Equation (2) using the calculated consecutive movements from Box 32.

Box 36 provides the means for compensating for the motion of and/or in the subject using the determined motion pattern. In one embodiment, this can be carried out during the acquisition by continuously moving the FOV in accordance with the determined motion pattern of the ROI. The position of the acquired volume can be changed by adjusting the gradients and the bandwidth of the RF pulses, and hence the acquisition protocol may be adapted to move the acquired volume during the acquisition in accordance with the method of the invention so that the ROI is at rest, or almost at rest, in the acquired volume or FOV.

The resulting output from the out-line is thereby a modification of the acquisition sequence sent to scanner 20. In other embodiments, Box 36 can be implemented by retroactively motion correcting the acquired signals or the reconstructed image using the knowledge of the motion pattern during acquisition.

Further details/boxes corresponding to some of the features described in relation to the method with reference to FIGS. 1 through 4 can be added to the out-line 30.

Although described in relation to renal motion in angiography, the various embodiments of the invention may be used in a wide variety of different applications. In one embodiment, it can be used for angiographic imaging of other vessels in the abdomen or thorax. In another embodiment, it can be used to avoid motion artefacts with small movements of limbs as mentioned previously, where the fixed point will be at the centre of the joint. Rotation or the upper arm relative to the shoulder joint, rotation of the lower arm relative to the elbow, rotation of the hand relative to the wrist, rotation of the upper leg relative to the hip, rotation of the lower leg relative to the knee, rotation of the foot relative to the ankle. In these cases the navigator could be positioned on the ROI leading to a scaling factor of 1. Another example is use for functional studies of the spine.

Although the present invention has been described in connection with the specified embodiments, it should not be construed as being in any way limited to the presented examples. The scope of the present invention is to be interpreted in the light of the accompanying claim set. In the context of the claims, the terms "comprising" or "comprises" do not exclude other possible elements or steps. Also, the mentioning of references such as "a" or "an" etc. should not be construed as excluding a plurality. Any use of reference signs in the claims with respect to elements indicated in the figures shall also not be construed as limiting the scope of the invention. Furthermore, individual features mentioned in different claims, may possibly be advantageously combined, and the mentioning of these features in different claims does not exclude that a combination of features is not possible and advantageous.

The invention claimed is:

1. A method of compensating for motion of a region-of-interest (ROI) in a subject during magnetic resonance imaging (MRI), the method comprising acts of:
    selecting within a first region of the ROI a fixed point pre-determined to be not affected by motion of the ROI and within a second region of the ROI a moving point pre-determined to be affected by the motion, the fixed point functioning as a field of view of an image produced by the MRI; and
    from the image
        identifying a movement of the moving point within the ROI,
        determining a motion pattern by rotating the moving point relative to the fixed point in accordance with the identified movement of the moving point, and
        adjusting the field of view on the basis of the determined motion pattern to reduce motion artefacts of the image.

2. The method according to claim 1, further comprising an act of producing a reconstructed MRI image using the adjusted field of view.

3. The method according to claim 2, further comprising an act of selecting the fixed point in the reconstructed image pre-determined to be not affected by motion of the ROI.

4. The method according to claim 3, further comprising an act of selecting the moving point in the reconstructed image having motion artefacts from the MR signal.

5. The method according to claim 1, further comprising an act of scaling the movement of the moving point within the ROI to obtain an adjusted movement of the moving point.

6. The method according to claim 1, wherein the motion artefacts are reduced when the MR signal is from scanning of vessels in the abdominal or thoracic region.

7. A magnetic resonance imaging (MRI) system for compensating for motion of a region-of-interest (ROI) in a subject during image acquisition, the system comprising:
    a user interface configured to receive input to select within a first region of the ROI a fixed point pre-determined to be not affected by motion of the ROI and within a second region of the ROI a moving point pre-determined to be affected by the motion, the fixed point functioning as a field of view of an image produced by the MRI; and
    a software application including program code configured to process the image to
        determine a movement of the moving point within the ROI,
        determine a motion pattern by rotating the moving point in relation to the fixed point in accordance with the determined movement of the moving point, and
        adjust the field of view on the basis of the determined motion pattern to reduce motion artefacts of the image.

8. A nontransitory computer readable medium storing a computer readable program product which when executed performs a method of compensating for motion of a region-of-interest (ROI) in a subject during magnetic resonance imaging (MRI), the method comprising acts of:
    selecting within a first region of the ROI a fixed point pre-determined to be not affected by motion of the ROI, and within a second region of the ROI a moving point pre-determined to be affected by the motion, the fixed point functioning as a field of view of an image produced by the MRI; and
    from the image
        determining a movement of the moving point within the ROI,
        determining a motion pattern by rotating the moving point in relation to the fixed point in accordance with the determined movement of the moving point, and
        adjusting the field of view on the basis of the determined motion pattern to reduce motion artefacts of the image.

9. A nontransitory computer readable medium storing a computer readable program product which when executed performs a method of compensating for motion of a region-of-interest (ROI) in a subject during magnetic resonance imaging (MRI), the method comprising acts of:
    selecting within a first region of the ROI a fixed point pre-determined to be not affected by motion of the ROI, and within a second region of the ROI a moving point pre-determined to be affected by the motion, the fixed point functioning as a field of view of an image produced by the MRI; and
    from the image
        determining a movement of the moving point,
        determining a motion pattern by rotating the moving point in relation the fixed point in accordance with the determined movement of the moving point, and
        adjusting the field of view on the basis of the determined motion pattern to reduce motion artefacts of the image.

* * * * *